United States Patent
Chung et al.

(10) Patent No.: US 6,819,564 B2
(45) Date of Patent: Nov. 16, 2004

(54) HEAT DISSIPATION MODULE

(75) Inventors: Chao-Tsai Chung, Taipee (TW); Cheng-Chen Cheng, Taipei (TW); Po-Yao Lin, Taipei (TW)

(73) Assignee: Asustek Computer Inc., Taipei (TW)

( * ) Notice: Subject to any disclaimer, the term of this patent is extended or adjusted under 35 U.S.C. 154(b) by 80 days.

(21) Appl. No.: 10/320,605

(22) Filed: Dec. 17, 2002

(65) Prior Publication Data

US 2003/0202327 A1 Oct. 30, 2003

(30) Foreign Application Priority Data

Apr. 30, 2002 (TW) ........................................ 91109033 A

(51) Int. Cl.$^7$ ................................................ H05K 7/20
(52) U.S. Cl. ........................ 361/697; 361/703; 257/722; 165/80.3; 165/185; 165/121; 165/126
(58) Field of Search ................................ 165/80.3, 121, 165/126, 185; 257/722; 361/687, 694–695, 697, 703

(56) References Cited

U.S. PATENT DOCUMENTS

| 5,597,034 A | * | 1/1997 | Barker et al. | ............... 165/80.3 |
| 6,196,300 B1 | * | 3/2001 | Checchetti | ................. 165/80.3 |
| 6,382,306 B1 | * | 5/2002 | Hsu | .......................... 165/80.3 |

* cited by examiner

*Primary Examiner*—Gregory D. Thompson
(74) *Attorney, Agent, or Firm*—Birch, Stewart, Kolasch & Birch, LLP

(57) ABSTRACT

A heat dissipation module. The heat dissipation module comprises a cover, a fan, a base and a plurality of fin assemblies. The fan is disposed on the cover. The base is disposed underneath the fan and has a protruding portion. The protruding portion has two slant surfaces and a top end. The protruding portion gradually tapers toward the fan. The plurality of fin assemblies are disposed on the slant surfaces of the protruding portion of the base.

16 Claims, 7 Drawing Sheets

HEAT DISSIPATION MODULE

BACKGROUND OF THE INVENTION

1. Field of the Invention

The present invention relates to a heat dissipation module, and in particular to a heat dissipation module for effectively cooling a CPU on a main board.

2. Description of the Related Art

Referring to FIG. 1, the conventional heat dissipation module 1 is composed of a fan 2 and a heat sink 4 with plural fins 6 formed thereon. According to the heat flow simulation analysis as shown in FIG. 2, the conventional heat dissipation module 1 has the following drawbacks.

(1) The airflow from the fan 2 flows through the heat sink 4 and flows out via opposite sides of the fins 6. Obviously, there is no airflow passing through the central area A of the heat sink 4. Thus, the efficiency of thermal exchange in the central area A is very low. The heat generated by the CPU 8 is concentrated on the central area A of the heat sink 4 and the spindle 22 of the fan 2 is located above the central area A. Thus, there is no airflow through the fins 6 in the central area A and the efficiency of heat dissipation of the conventional heat dissipation module 1 is enormously reduced.

(2) The heat sink 4 has a flat bottom and the airflow from the fan 2 flows downwardly to the flat bottom. Because of the short distance between the fan 2 and the heat sink 4 and the high density of the fins 6, the airflow is subject to high back pressure. Thus, the amount of airflow from the fan 2 is decreased and the efficiency of heat dissipation of the conventional heat dissipation module 1 is reduced.

SUMMARY OF THE INVENTION

An object of the invention is to provide a heat dissipation module. The heat dissipation module comprises a base having a protruding portion having two slant surfaces; at least one fin assembly disposed on the slant surfaces of the protruding portion of the base; a cover, disposed over and covering the base; a fan, disposed on the cover. Besides, the protruding portion gradually shrinks toward said fan.

A detailed description will be given by the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
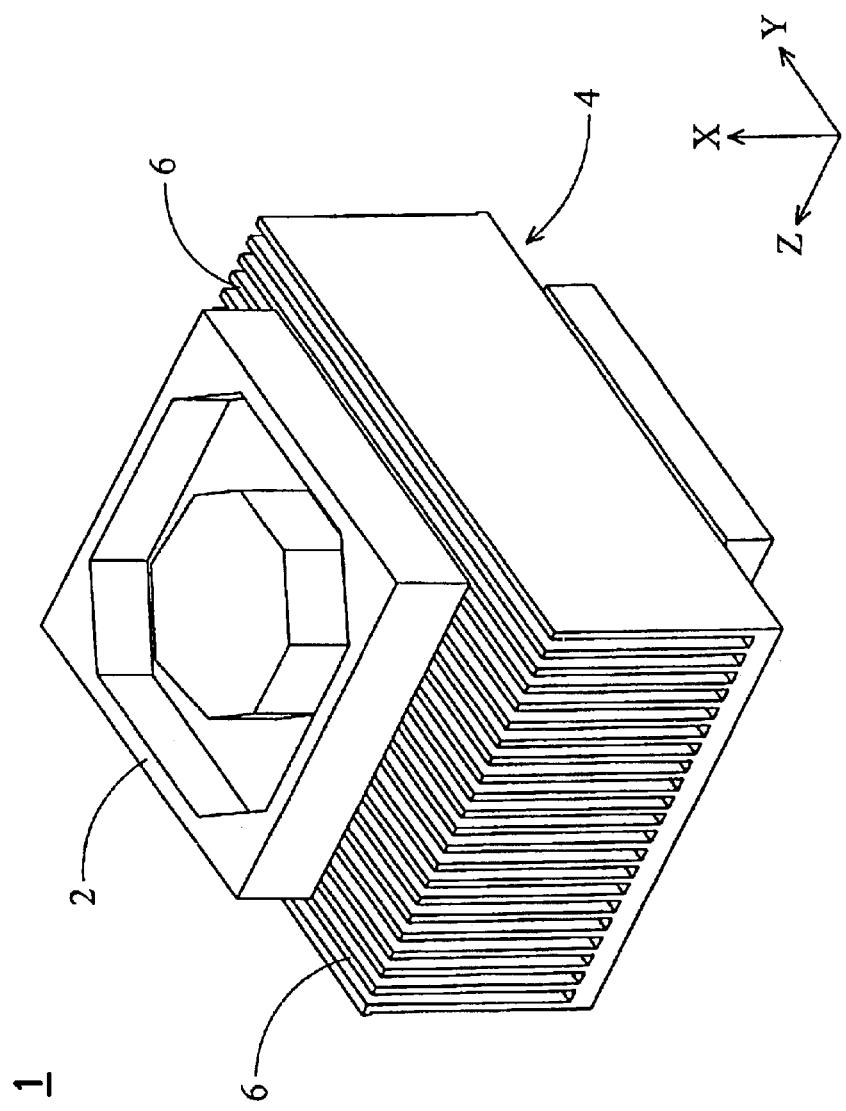
FIG. 1 shows a conventional heat dissipation module for a CPU.
Figure 2:
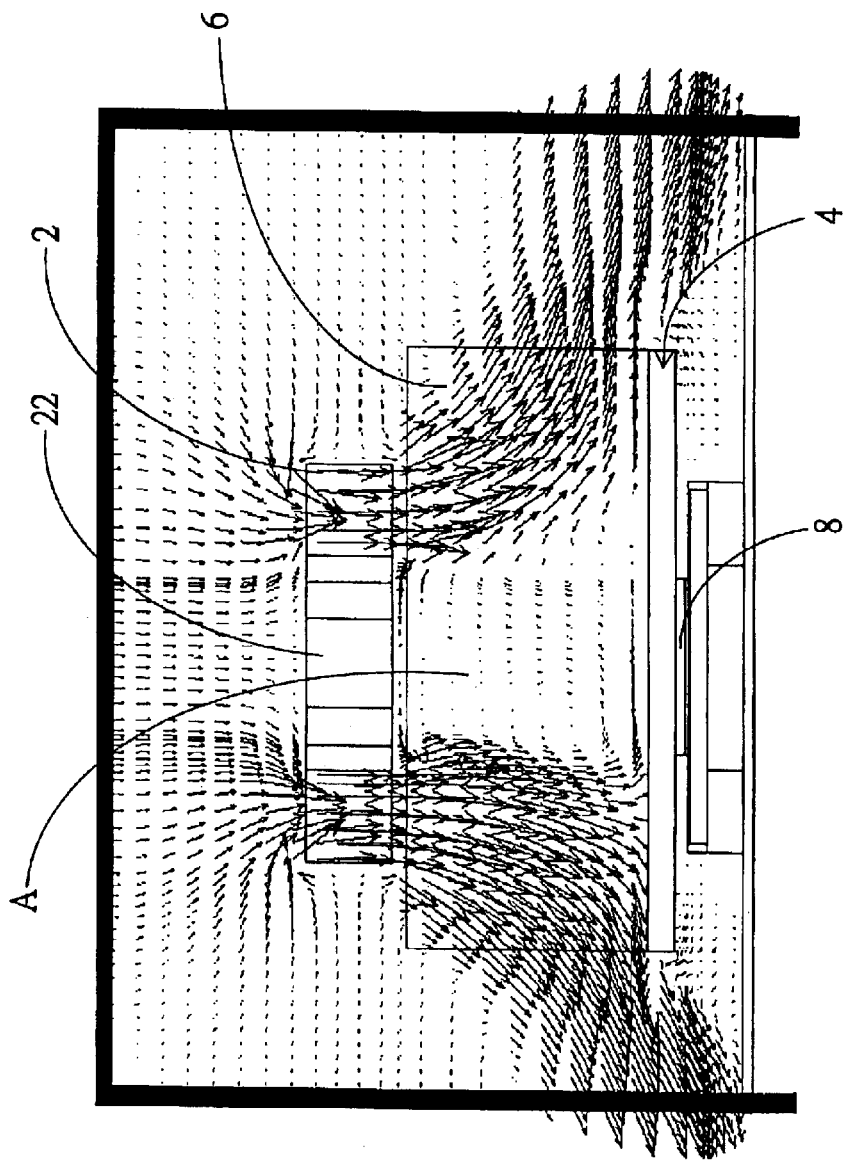
FIG. 2 shows the heat flow simulation analysis according to the conventional heat dissipation module of FIG. 1.
Figure 3:
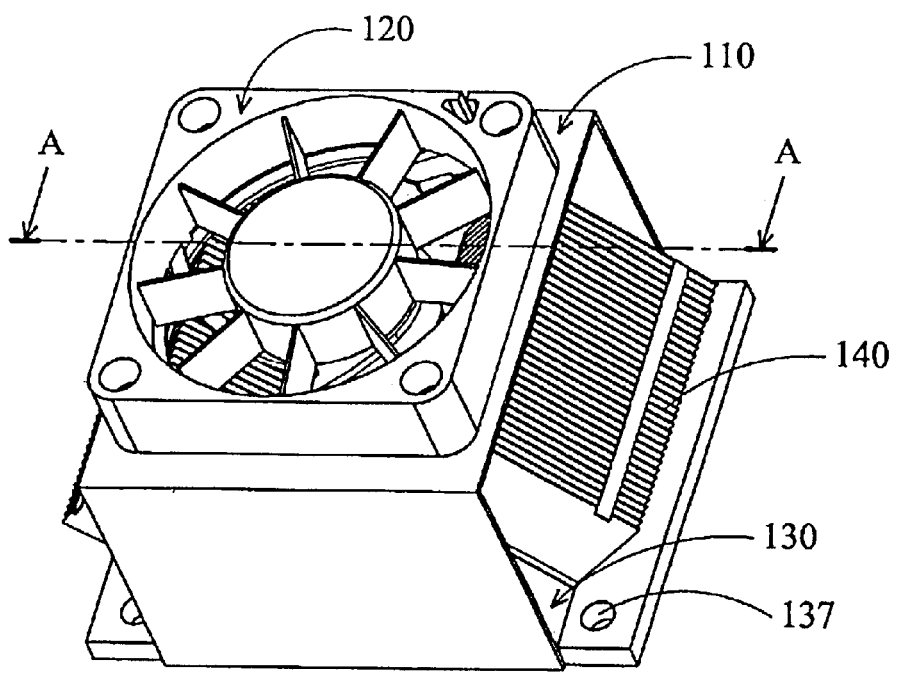
FIG. 3 shows a perspective assembly view of the present heat dissipation module.
Figure 4:
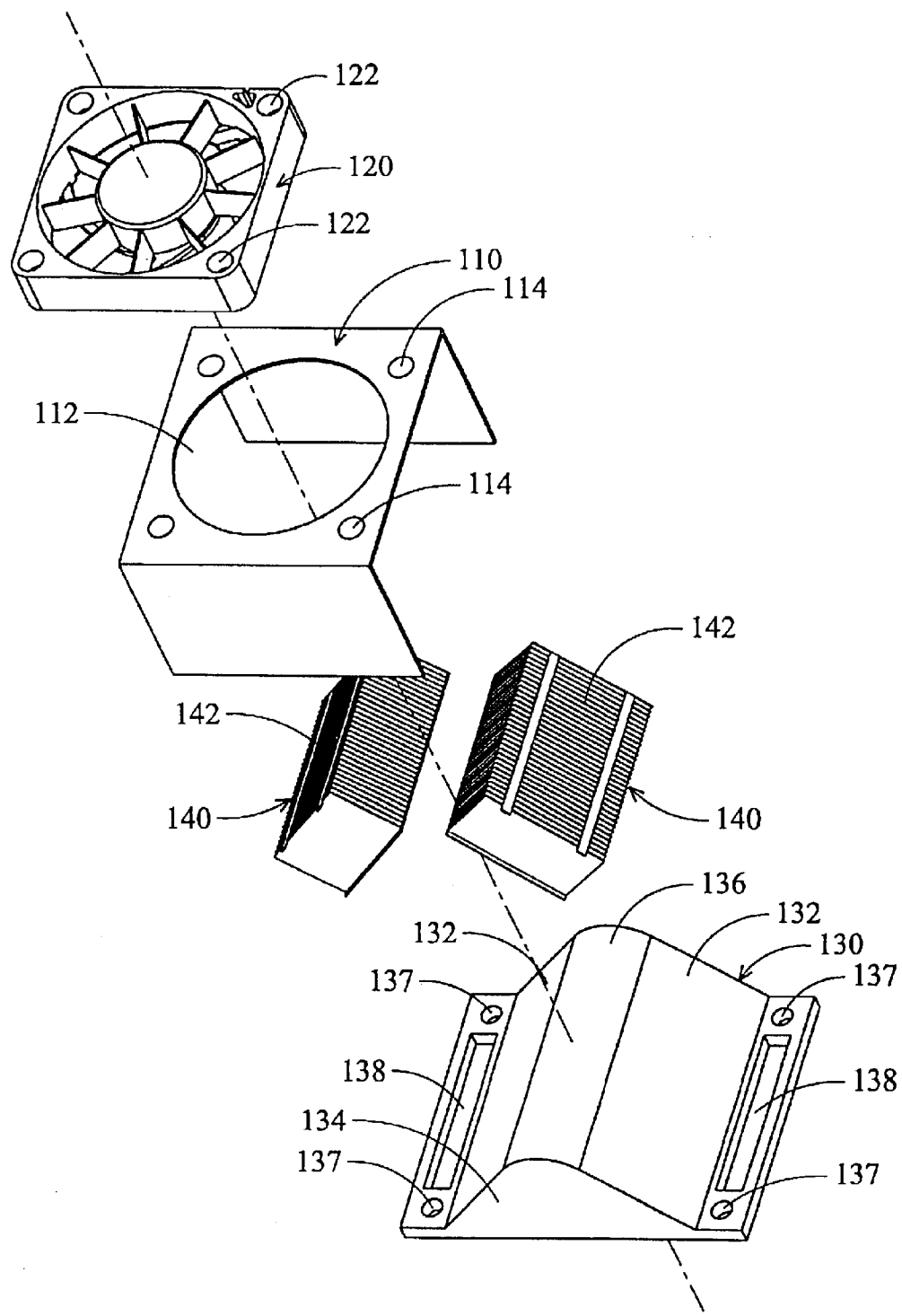
FIG. 4 shows a perspective exploded view according to FIG. 3.

Referring to FIG. 3 and FIG. 4, the heat dissipation module 100 comprises a cover 110, a fan 120, a base 130 and two fin assemblies 140.

Figure 5:
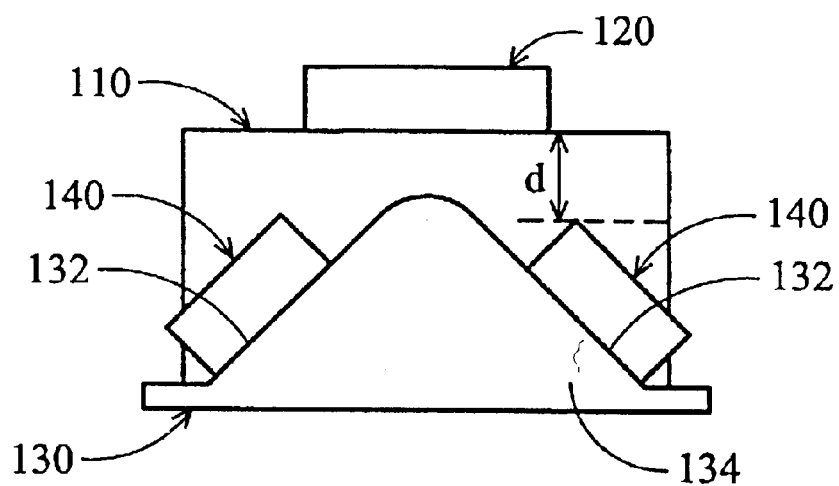
FIG. 5 shows a cross section taken along line A—A of FIG. 3.
Figure 6:
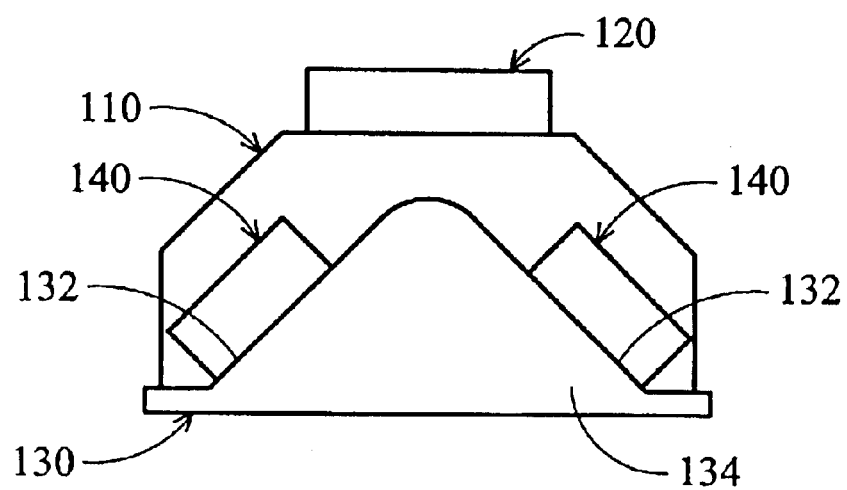
FIG. 6 shows a cross section of the present heat dissipation module having another cover.

The fan 120 is disposed on the airflow inlet 112 of the cover 110. The fan 120 is fixed on the cover 110 by screwing four bolts (not shown) to four fixing holes 114 of the cover 110 through four fixing holes 122 of the fan 120. In addition, as shown in FIG. 5, a predetermined distance d exists between the cover 110 and the fin assemblies 140. Because of the predetermined distance d, the airflow distribution can be more uniform across the fin assemblies 140 when the fan 120 provides the airflow to the fin assemblies 140. As shown in FIG. 6, the cover 110 can extend in two directions parallel to the fin assemblies 140. Thus, the cover 110 can prevent the airflow from circulation.

The base 130 is disposed underneath the cover 110 and has a protruding portion 134. The protruding portion 134 has two slant surfaces 132 and a top end. The top end of the protruding portion 134 of the base 130 is a smooth curved portion 136. The protruding portion 134 gradually shrinks toward the fan 120. The two fin assemblies 140 are disposed on the two slant surfaces 132, respectively. The fin assemblies 140 are composed of a plurality of parallel flat fins 142. The fin assemblies 140 can be disposed on the slant surfaces 132 of the base 130 by heat conducting glue, welding and insertion.

Additionally, the base 130 further comprises two rectangular holes 138 formed adjacent to the lower part of the slant surfaces 132, respectively. The rectangular holes 138 are used to reduce airflow resistance when the airflow flows through the flat fins 142 of the fin assemblies 140, thus making the airflow from the fan 120 smoother and faster.

Additionally, four fixing holes 137 are formed on the base 130 for fixing the base 130 onto a main board (not shown). A CPU (not shown) is placed between the base 130 and the mother board (not shown) and contacts the bottom of the base 130. The heat generated by the CPU is transferred to the protruding portion 134 of the base 130 by thermal conduction. Then, the heat is transferred to the fins 142 of the fin assemblies 140. And then, the heat is dissipated to the atmosphere by thermal convection between the flat fins 142 and the airflow from the fan 120.

Figure 7:
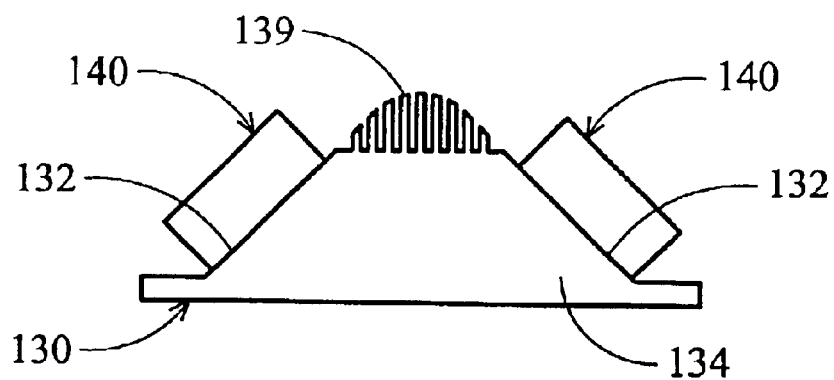
FIG. 7 is a schematic view showing a plurality of fins formed on the curved portion of the base of the present heat dissipation module.
Figure 8:
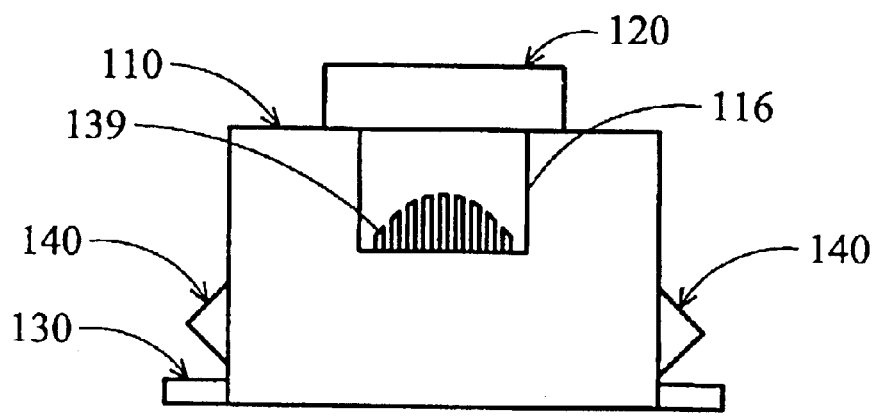
FIG. 8 is a schematic view showing a pair of airflow guiding holes formed on opposite sides of the cover of the present heat dissipation module, respectively.

Referring to FIG. 7, a plurality of fins 139 are formed on the top end of the protruding portion 134 to enhance heat dissipation. In addition, as shown in FIG. 8, two airflow guiding holes 116 corresponding to the fins 139 are formed on opposite sides of the cover 110 for guiding the heat in the fins 139 outward.

In addition to the above-mentioned structure of the heat dissipation module 100, the fin assemblies 140 can be composed of a plurality of parallel column fins (not shown).

Figure 9:
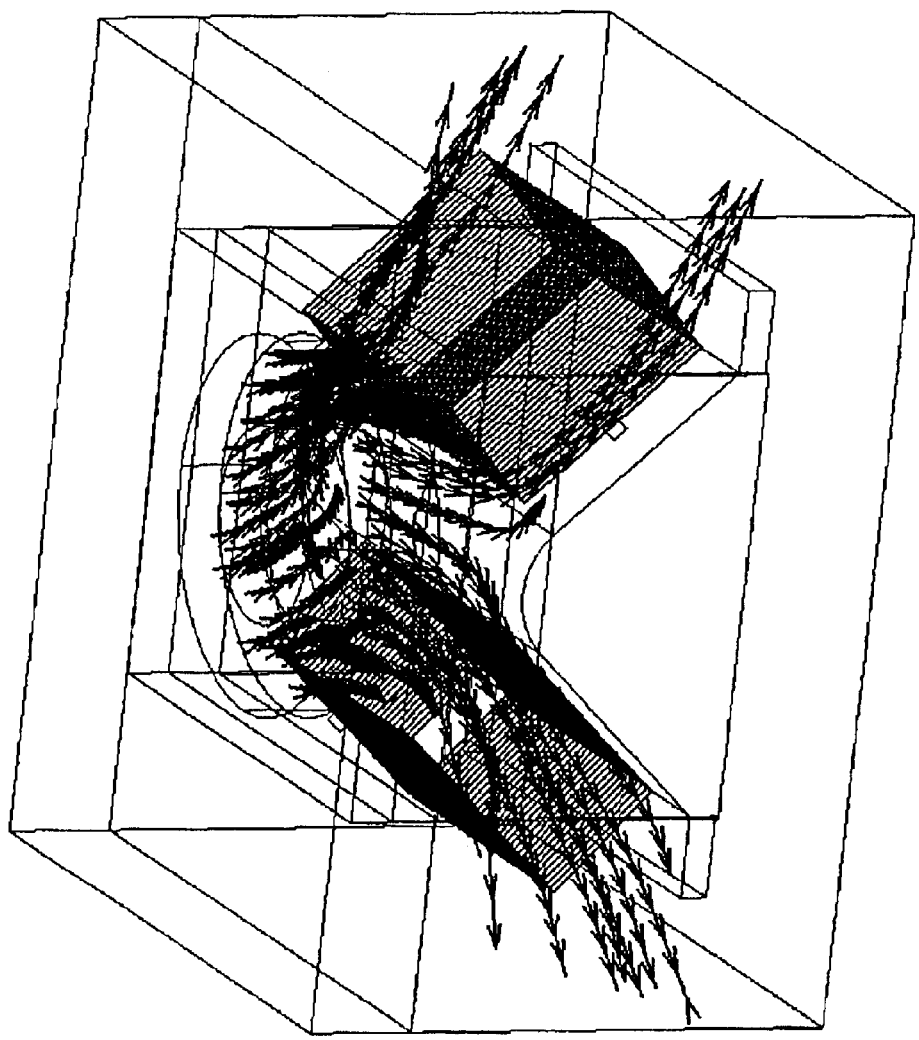
FIG. 9 shows the heat flow simulation analysis according to FIG. 3 and FIG. 4.

FIG. 9 shows the heat flow simulation analysis according to FIG. 3 and FIG. 4. The advantages of the heat dissipation module 100 are described as follows.

(1) In order to rectify the stagnation zone (the central area of the heat sink) of the conventional heat dissipation module, the central thickness of the base 130 of the invention is increased and the base 130 is made of a metal material having a high thermal conductivity, such as copper or aluminum. The heat in the stagnation zone (the zone under the spindle of the fan) can be rapidly transferred to the fin assemblies 140 by thermal conduction. The heat generated by the CPU is rapidly and effectively transferred to the base 130 and the fin assemblies 140. Then, the heat is dissipated to the atmosphere by thermal convection between the fins 142 of the fin assemblies 140 and the airflow from the fan 120. Thus, the heat dissipation performance is enhanced.

(2) Airflow guiding passages are naturally formed on the slant surfaces 132 of the base 130 and the fin assemblies 140. Thus, the airflow can smoothly pass through the fins 142 and the airflow resistance is enormously reduced. The back pressure subjected by the fan 120 is reduced, such that the airflow amount from the fan 120 is increased.

While the invention has been described by way of example and in terms of the preferred embodiment, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation module, comprising:
   a base, having a protruding portion, the protruding portion having two slant surfaces;
   at least one fin assembly disposed on the slant surfaces of the protruding portion of the base
   a cover, disposed over and covering the base; and
   a fan, disposed on the cover, wherein said protruding portion gradually shrinks toward said fan.

2. The heat dissipation module as claimed in claim 1, wherein the protruding portion further comprises a curved portion.

3. The heat dissipation module as claimed in claim 1, wherein the base further comprises two rectangular holes formed adjacent to the lower part of the slant surfaces, respectively.

4. The heat dissipation module as claimed in claim 1, wherein the cover further comprises two openings and two side walls, the openings corresponding to the slant surfaces, respectively, and the side walls adjacent to the openings.

5. The heat dissipation module as claimed in claim 1, wherein the cover extends in directions parallel to the fin assemblies.

6. The heat dissipation module as claimed in claim 1, wherein the fin assemblies are composed of a plurality of parallel flat fins.

7. The heat dissipation module as claimed in claim 1, wherein the fin assemblies are composed of a plurality of parallel column fins.

8. The heat dissipation module as claimed in claim 1, wherein the fin assemblies are attached to the slant surfaces by heat conducting glue.

9. The heat dissipation module as claimed in claim 1, wherein the fin assemblies are welded onto the slant surfaces.

10. The heat dissipation module as claimed in claim 1, wherein the fin assemblies are inserted into the slant surfaces.

11. The heat dissipation module as claimed in claim 1, wherein the fan is fixed to the cover by plural bolts.

12. The heat dissipation module as claimed in claim 1, wherein the base further comprises at least one fixing hole for fixing the base to a main board.

13. The heat dissipation module as claimed in claim 2, wherein the curved portion further comprises a plurality of fins.

14. The heat dissipation module as claimed in claim 1, wherein the side wall of the cover further comprises an airflow guiding hole.

15. The heat dissipation module as claimed in claim 1, wherein the base and the fin assemblies are made of copper.

16. The heat dissipation module as claimed in claim 1, wherein the base and the fin assemblies are made of aluminum.

* * * * *